United States Patent
Liao et al.

(10) Patent No.: US 6,553,053 B2
(45) Date of Patent: Apr. 22, 2003

(54) VERTICAL CAVITY SURFACE EMITTING LASER HAVING IMPROVED LIGHT OUTPUT FUNCTION

(75) Inventors: Andrew Shuh-Huei Liao, San Jose, CA (US); Ghulam Hasnain, Palo Alto, CA (US); Chihping Kuo, Milpitas, CA (US); Hao-Chung Kuo, San Jose, CA (US); Zhiqing Shi, San Jose, CA (US); Minh Ngoc Trieu, San Jose, CA (US)

(73) Assignee: LuxNet Corporation, Fremont, CA (US)

( * ) Notice: Subject to any disclaimer, the term of this patent is extended or adjusted under 35 U.S.C. 154(b) by 0 days.

(21) Appl. No.: 09/912,611

(22) Filed: Jul. 25, 2001

(65) Prior Publication Data

US 2003/0021317 A1 Jan. 30, 2003

(51) Int. Cl.[7] ................................................. H01S 3/08
(52) U.S. Cl. .............................. 372/96; 372/45; 372/46
(58) Field of Search ........................... 372/43–50, 54, 372/103, 107, 7, 29.013, 39, 96

(56) References Cited

U.S. PATENT DOCUMENTS

| | | | |
|---|---|---|---|
| 4,949,350 A | | 8/1990 | Jewell et al. |
| 5,115,442 A | | 5/1992 | Lee et al. |
| 5,256,596 A | | 10/1993 | Ackley et al. |
| 5,337,327 A | | 8/1994 | Ackley |
| 5,348,912 A | | 9/1994 | Choquette et al. |
| 5,359,618 A | | 10/1994 | Lebby et al. |
| 5,373,522 A | | 12/1994 | Holonyak, Jr. et al. |
| 5,446,752 A | | 8/1995 | Ackley et al. |
| 5,493,577 A | | 2/1996 | Choquette et al. |
| 5,677,924 A | * | 10/1997 | Bestwick ................... 372/46 |
| 5,719,891 A | * | 2/1998 | Jewell ....................... 257/13 |
| 5,724,374 A | * | 3/1998 | Jewell ....................... 372/46 |
| 5,774,487 A | | 6/1998 | Morgan |
| 5,822,356 A | * | 10/1998 | Jewell ....................... 372/46 |
| 5,896,408 A | | 4/1999 | Corzine et al. |
| 5,903,589 A | * | 5/1999 | Jewell ....................... 257/43 |
| 5,903,590 A | | 5/1999 | Hadley et al. |
| 5,940,422 A | * | 8/1999 | Johnson ..................... 372/45 |
| 6,014,395 A | * | 1/2000 | Jewell ....................... 257/43 |
| 6,055,262 A | * | 4/2000 | Cox et al. .................. 372/45 |
| 6,075,804 A | * | 6/2000 | Deppe et al. ............... 372/46 |
| 6,128,109 A | * | 10/2000 | Jenkins et al. ............. 359/11 |
| 6,160,830 A | | 12/2000 | Kiely et al. |
| 6,169,756 B1 | | 1/2001 | Chirovsky et al. |
| 6,269,109 B1 | * | 7/2001 | Jewell ....................... 372/43 |
| 6,320,893 B1 | * | 11/2001 | Ueki .......................... 372/45 |

OTHER PUBLICATIONS

Lear, K.L., Mar., A., Choquette K.D., et al—"High frequency modulation of oxide–confined vertical–cavity surface emitting lasers," Electronics letters vol. 32, No. 5 (Feb. 29, 1996); 457–459.

(List continued on next page.)

Primary Examiner—Paul Ip
Assistant Examiner—Tuan Nguyen
(74) Attorney, Agent, or Firm—Calvin B. Ward

(57) ABSTRACT

A laser diode that includes a light guiding structure that improves the light-output-versus-current curve by altering the multiple spatial modes of the laser diode. A laser diode according to the present invention includes a bottom mirror constructed on an electrically conducting material, an active region constructed from a first conductive spacer situated above the bottom mirror, a light emitting layer, and a second conductive spacer situated above the light emitting layer. The laser diode also includes a top mirror constructed from a plurality of mirror layers of a semiconducting material of a first conductivity type that are located above the second conductive spacer. The adjacent mirror layers have different indexes of refraction. One or more of the top mirror layers is altered to provide an aperture defining layer that includes an aperture region that alters the spatial modes of the device.

8 Claims, 4 Drawing Sheets

OTHER PUBLICATIONS

Weigl, B., Grabherr, M., Reiner, G., et al—"High efficiency selectively oxidised MBE grown vertical–cavity surface–emitting lasers," Electronics Letters vol. 32, No. 6 (Mar. 14, 1996); 557–559.

Ochiai, M., Guidice, G.E., Temkin, H., et al—"Kinetics of thermal oxidation of AlAs in water vapor," Appl .Phys. Lett. vol. 68 No. 14 (Apr., 1996); 1898–1900.

Huffaker, D.L., Deppe, D.G., Lei, C., et al—"Sealing AlAs agalinst oxidative decomposition and its use in device fabrication," Appl .Phys. Lett. vol. 68 No. 14 (Apr. 1996); 1948–1950.

Deng, H. and Deppe, D.G.—"Oxide–confined vertical–cavity laser with additional etched void confinement," Electronics Letters vol. 32, No. 10 (May 9, 1996); 900–901.

Choquette, Kent D., Chow, W.W., Hagerott Crawford, M., et al– "Threshold investigation of oxide–confined vertical–cavity laser diodes," Appl .Phys. Lett. vol. 68, No. 26 (Jun. 24 1996); 3689–3691.

Twesten, R.D., Follstaedt, D.M., Choquette, K.D., et al—"Microstructure of laterally oxidized AlxGal–xAs layers in vertical–cavity lasers", Appl .Phys. Lett. vol. 69 No. 1 (Jul. 1, 1996); 19–21.

Schneider, R.P., Tan, M.R.T., Corzine, S.W., et al—"Oxide confined 850 nm vertical–cavity lasers for multimode–fibre data communications," Electronics Letters vol. 32, No. 14 (Jul. 4, 1996); 1300–1302.

Grabherr, M., Weigl, B., Reiner, G., et al—"High power top surface emitting oxide confined vertical–cavity laser diodes," Electronic Letters vol. 32, No. 18 (Aug. 29, 1996): 1723–1724.

Choquette, Kent D., Geib, K.M., Chui, H.C., et al—"Selective Oxidation of buried AlGaAs versus AlAs layers," Appl .Phys. Lett. vol. 69, No. 10 (Sep. 2, 1996); 1385–1387.

Weigl, B., Reiner, G., Grabherr, M., et al—"Oxidised GaAs QW vertical–cavity lasers with 40% power conversion efficiency," Electronic Letters vol. 32, No. 19 (Sep. 12, 1996); 1784–1786.

Yang, Gye Mo, MacDougal, Michael H., and Dapkus, P. Daniel—"Effects of current spreading under oxide current aperture in vertical–cavity surface–emitting lasers," J. Appl .Phys. vol. 80, No. 9(Nov. 1, 1996); 4837–4840.

Oh, T.H., Huffaker, D.L., and Deppe, D.G.—Size effects in small oxide confined vertical–cavity surface–emitting lasers,: Appl .Phys. Lett. vol. 69 No. 21 (Nov. 18, 1996); 3152–3154.

Y.H. Lee et al—"Top Surface Emitting GaAs Four–Quantum–Well Lasers Emitting AT 0.85um" Electronics Letters vol. 26, No. 11 (1990) 710–711.

Huffaker, D.L. Shin, J. and Deppe, D,G, et al—"Improved Mode Stability in Low Threshold Single Quantum Well Native–Oxide Defined Vertical–Cavity Lasers", Appl. Phys Lett. 65 (Nov. 21, 1994); 2642–2644.

Huffaker, D.L. Shin, J. and Deppe, D.G.—"Low Threshold Half–Wave Vertical–Cavity Lasers", Electron. Lett. 30, (Nov., 10, 1994); 1946–1947.

Choquette,K.D., Schneider, R.P., Lear, K.L., et al—"Low Threshold voltage vertical–cavity lasers fabricated by selective oxidation," Electronics Letters vol. 30, No. 24 (Nov. 24, 1994) 2043–2044.

MacDougal, M. H., et al—"Ultralow Threshold Current Vertical–Cavity Surface–Emitting Lasers with AlAs–oxide––GaAs Distributed Bragg Reflectors," IEEE photonics Technology Lett. vol.; 7 (Mar. 1995); 229–231.

Hayashi, Y. Mukaihara, T., Hatori, N., et al—"Record low–threshold index guided InGaAs/GaAlAs vertical–cavity surface emitting laser with a native oxide confinement structure," Electronics Letters vol. 31, No. 7 (Mar. 30, 1995); 560–562.

Lear, K.L., Choquette, K.D., Schneider, R.P., et al—"Modal analysis of a small surface emitting laser with a selectively oxidzed waveguide," Appl. Phys. Lett. vol. 66, No. 20 (May 15, 1995); 2616–2618.

Yang, G.M., MacDougal, M.H., and Dapkus, P.D.–"Ultralow threshold current–vertical cavity surface–emitting lasers obtained with selective oxidation," Electronics Letters vol. 31, No. 11 (May 25, 1995); 886–888.

Choquette, Kent D., Lear, K.L., Scheider, R.P., et al—"Cavity characteristics of selectively oxidized vertical–cavity lasers", Appl .Phys. Lett. vol. 66, No. 25 (Jun. 19, 1995); 3413–3415.

Li, G.S., Lim, S.F., Yuen, W., et al—"Polarisation and modal behaviour of low threshold oxide and airgap confined vertical–cavity lasers," Electronics Letters, vol. 31, No. 23 (Nov. 9, 1995); 2014–2015.

Coldren, L.A., Thibeault, B.J., Hegblom, E.R. et al—"Dielectric apertures as intracavity lenses in vertical–cavity lasers", Appl .Phys. Lett. vol. 68, No. 3 (Jan. 15, 1996), 313–315.

Floyd, P.D., Thibeault, B.J., Coldren, L.A. et al—"Scalable etched–pillar, AlAs–oxide defined vertical–cavity lasers", Electronics Letters vol. 32, No. 2 (Jan. 18, 1996); 114–116.

Jung, C., Jager, R., Grabherr, M., et al—"4.8mW singlemode oxide confined top–surface emitting vertical–cavity laser diodes," Electronics Letters vol. 33, No. 21 (Oct. 9, 1997); 1790–1791.

Kim, J.H., Lim, D.H., Kim, K.S., et al—"Lateral wet oxidation of AlxGa1–xAs–GaAs depending on its structures", Appl .Phys. Lett. vol. 69, No. 22 (Nov. 25, 1996) 3357–3359.

Jager, R., Grabherr, M., Jung, C., et al—"57% wallplug efficiency oxide–confined 850 nm wavelength GaAs VCSELs". Electronics Letters vol. 33, No. 4 (Feb. 13, 1997); 330–331.

Choquette, Kent D., Chow, W.W., Hadley, G.R., et al—"Scalability of small–aperture selectively oxidized vertical–cavity lasers," Appl .Phys. Lett. vol. 70 No. 7 (Feb. 17, 1997); 823–825.

Blum, O., Ashby, C.I.H., and Hou, H.Q.—"Barrier layer thickness control of selective wet oxidation of AlGaAs for embedded optical elements," Appl .Phys. Lett. vol. 70 No. 21 (May 26, 1997); 2870–2872.

Choquette, K.D. Hadley, G.R., Hou, H.Q., et al—"Leaky mode vertical cavity lasers using cavity resonance modification," Electronics Letters, vol. 34, No. 10 (May 14, 1998); 991–993.

Ha, K.H., Lee, Y.H. Shin, H.K., et al—"Polarisation anisotropy in asymmetric oxide aperture VCSELs," Electronics Letters, vol. 34, No. 14 (Jul. 9, 1998); 1401–1402.

Lui, G. Seurin, J.F., Chuang, S.L., et al—"Mode selectively study of vertical–cavity surface emitting lasers," Appl .Phys. Lett. vol. 73, No. 6 (Aug. 10, 1998); 726–728.

Choi, Won–Jin, and Dapkus, P.Daniel—Self–defined AlAs–oxide–current–aperture buried heterostructure vertical––cavity surface–emitting laser,: Appl .Phys. Lett. vol. 73, No. 12 (Sep. 21, 1998); 1661–1663.

Evans, P.W., Wierer, J.J., and Holonyak, N.—"AlxGa1–xAs native–oxide–based distributed Bragg reflectors for vertical cavity surface emitting lasers," J. Appl .Phys. vol. 84, No. 10 (Nov. 15, 1998); 5436–5440.

L.M.F. Chirovsky et al—"Implant–Apertured and Index–Guided Vertical–Cavity Surface–emitting Lasers (12–VCSELs)." IEEE PTL vol. 11, No. 5, 500–503 (1999).

G.Dang et al—"High–Speed Modulation of 850nm Intracavity Contacted Shallow Implant–Apertured Vertical–Cavity Surface–Emitting Lasers." IEEE PTL vol. 13, No. 9, 924–926 (2001).

* cited by examiner

VERTICAL CAVITY SURFACE EMITTING LASER HAVING IMPROVED LIGHT OUTPUT FUNCTION

FIELD OF THE INVENTION

This invention relates generally to vertical cavity surface-emitting lasers (VCSELs) and, more particularly, to an improved VCSEL in which the current channeling function utilizes an ion-implanted or diffused aperture region.

BACKGROUND OF THE INVENTION

Semiconductor laser diodes were originally fabricated in a manner that led to a diode structure in which light is emitted parallel to the surface of the semiconductor wafer with a cavity constructed from mirrors that are perpendicular to the surface of the substrate. Unfortunately, this structure does not lend itself to low cost "mass" manufacturing or to the cost-effective fabrication of two-dimensional arrays of laser diodes.

These problems are overcome by a class of laser diodes that is fabricated such that the laser structure is perpendicular to the surface of the semiconductor wafer and the light is emitted perpendicular to the surface. These laser diodes are commonly known as Vertical Cavity Surface-Emitting Lasers (VCSELs). A VCSEL may be viewed as a laser having mirrors constructed from alternating layers of material having different indices of refraction. These lasers are better suited for the fabrication of arrays of lasers for displays, light sources, optical scanners, and optical fiber data links. Such lasers are useful in optical communication systems for generating the light signals carried by optical fibers and the like.

Compared to conventional edge-emitting semiconductor lasers, VCSELs have a number of desirable characteristics. The use of multi-layered DBR mirrors to form a cavity resonator perpendicular to the layers eliminates the need for the cleaving operation commonly used to create the cavity mirrors used in edge emitting lasers. The orientation of the resonator also facilitates the wafer-level testing of individual lasers and the fabrication of laser arrays.

To achieve high-speed operation and high fiber-coupling efficiency, it is necessary to confine the current flowing vertically in the VCSEL, and thus the light emission, to a small area. There are two basic prior art current confinement schemes for VCSELs. In the first scheme, a conductive aperture is defined by means of an ion-implanted, high-resistivity region in the semiconductor Distributed-Bragg-Reflector (DBR) mirror. Such a scheme is taught in Y. H. Lee, et al., Electr. Lett. Vol. 26, No. 11, pp. 710–711 (1990), which is hereby incorporated herein by reference. In this design small ions (e.g. protons) are deeply implanted (e.g. 2.5 to 3 μm) in the DBR mirror. The implantation damage converts the semiconductor material through which the ions traveled to highly resistive material. Current is provided to the light generation region via an electrode that is deposited on the top surface of the VCSEL.

Unfortunately, ion-implanted VCSELs exhibit multiple spatial modes, which lead to a light-output-versus-current curve that often displays kinks due to the random and varying nature of the multiple spatial modes. This kinky light-output-versus-current behavior can produce a "noisy" waveform, and can degrade the performance of optical communication systems based on such designs. Prior art devices have been proposed to reduce the kinks in the light-output-versus-current characteristics by introducing additional structure in the light-emitting area; however, such solutions increase the cost and complexity of the devices.

In the second design, the current confinement aperture is achieved by generating a high-resistivity oxide layer embedded in the semiconductor DBR mirror. Such a scheme is taught in D. L. Huffaker, et al., Appl. Phys. Lett., vol. 65, No. 1, pp. 97–99 (1994) and in K. D. Choquette, et al., Electr. Lett., Vol. 30, No. 24, pp. 2043–2044 (1994), both of which are incorporated herein by reference. In this design, an annular insulating ring having a conducting center is generated by oxidizing one or more layers of Al-containing material in the DBR mirror in a high-temperature wet Nitrogen atmosphere. The size of the oxide aperture is determined by the Al concentration of the Al-containing layers, the temperature, the moisture concentration of the oxidizing ambient, and the length of the oxidation time. The oxidation rate is very sensitive to all of these parameters, and hence, the oxidation process is not very reproducible. As a result, device yields are less than ideal. In addition, the oxidization process leads to stress within the device, which can further reduce yields.

Broadly, it is the object of the present invention to provide an improved VCSEL and method for making the same.

The manner in which the present invention achieves its advantages can be more easily understood with reference to the following detailed description of the preferred embodiments of the invention and the accompanying drawings.

SUMMARY OF THE INVENTION

The present invention is a laser diode that includes a light guiding structure that improves the light-output-versus-current curve by altering the multiple spatial modes of the laser diode. A laser diode according to the present invention includes a bottom mirror constructed on an electrically conducting material, an active region constructed from a first conductive spacer situated above the bottom mirror, a light emitting layer, and a second conductive spacer situated above the light emitting layer. The laser diode also includes a top mirror constructed from a plurality of mirror layers of a semiconducting material of a first conductivity type that are located above the second conductive spacer. The adjacent mirror layers have different indexes of refraction. One or more of the top mirror layers is altered to provide an aperture defining layer that includes an aperture region and an implant region, the aperture region includes an aperture semiconducting material of the first conductivity type, the implant region surrounds the aperture region and includes an implant material that alters the reflectivity of the mirror layers in the implant region, the implant region having a resistivity of less than $5 \times 10^6$. The aperture defining layer is preferably located within a distance equal to 20 mirror layers of the light emitting layer. The implant material is preferably an element chosen from the group consisting of Cr, Ti, and Fe.

DETAILED DESCRIPTION OF THE PREFERRED EMBODIMENTS

Figure 1:
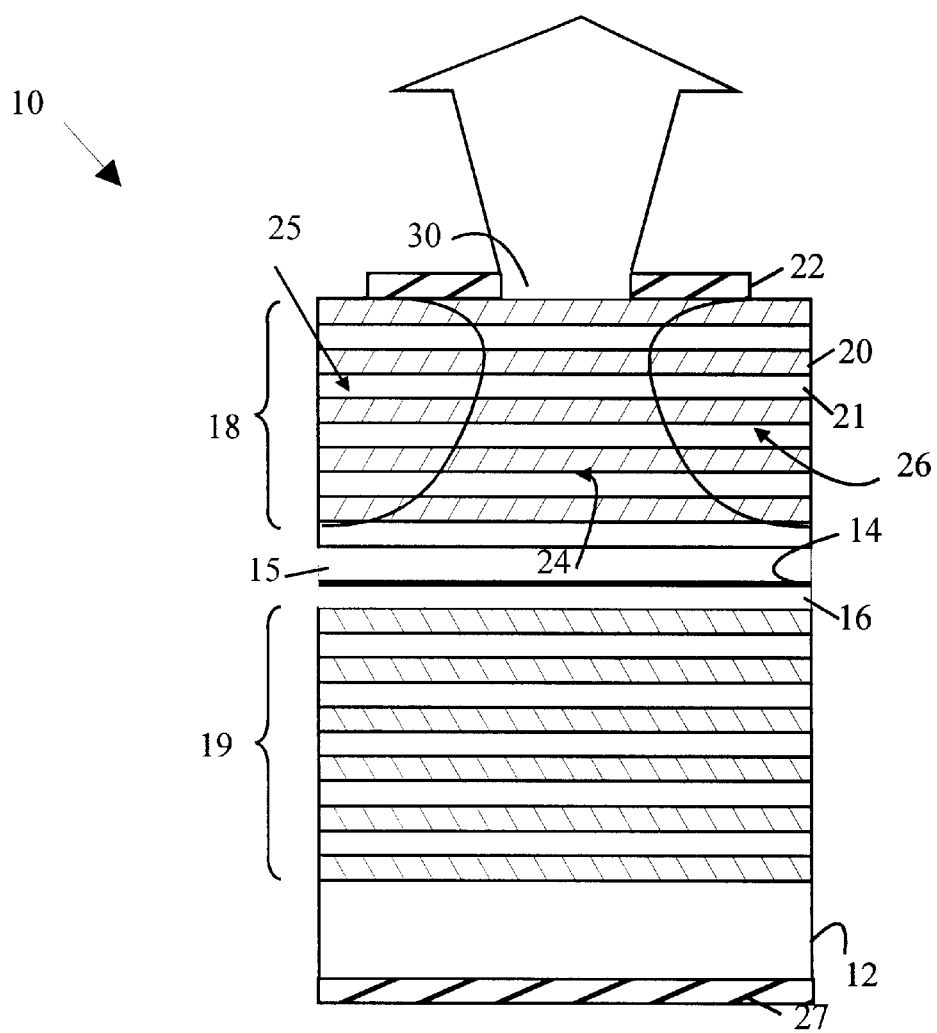
FIG. 1 is a cross-sectional view of a conventional ion-implanted VCSEL 10.

The present invention may be more easily understood with reference to FIG. 1, which is a cross-sectional view of a conventional VCSEL 10. Since construction of VCSELs is well known to those skilled in the laser arts, it will not be described in detail here. For the purposes of this discussion, it is sufficient to note that VCSEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth. Substrate 12 is an n-type semiconductor in the example shown in FIG. 1.

The active region is typically constructed from a layer having one or more quantum wells of InGaAs, GaAs, AlGaAs, InGaAsN, or InAlGaAs that is separated from mirror regions 18 and 19 by spacers 15 and 16, respectively. The choice of material depends on the desired wavelength of the light emitted by the VCSEL. In addition, devices based on bulk active regions are known to the art. Thus, layer 14 may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light that is to be output by the VCSEL. The stacked layers form Bragg mirrors. The stacks are typically constructed from alternating layers of AlAs or AlGaAs and GaAs or AlGaAs of lower Al concentration. The layers in the upper mirror region 18 are typically doped to be p-type semiconductors and those in the lower mirror region 19 are doped to be n-type semiconductors. Substrate 12 is preferably an n-type contact. Bottom electrode 27 is preferably an n-ohmic contact. However, n-i-p diode structures may also be constructed by growing the structures on a p-substrate or a semi-insulating substrate with a p-layer deposited thereon.

In one of the prior art designs discussed above, the current flow between electrodes 22 and 27 is confined to region 24 by implanting regions 25 and 26 to convert the regions to regions of high resistivity. This is typically accomplished by implanting with hydrogen ions. To provide sufficient current through the light generating region, electrode 22 must extend over the light generating region to some degree. As noted above, this overlap can cause a significant reduction in device efficiency in small VCSELs.

Figure 2:
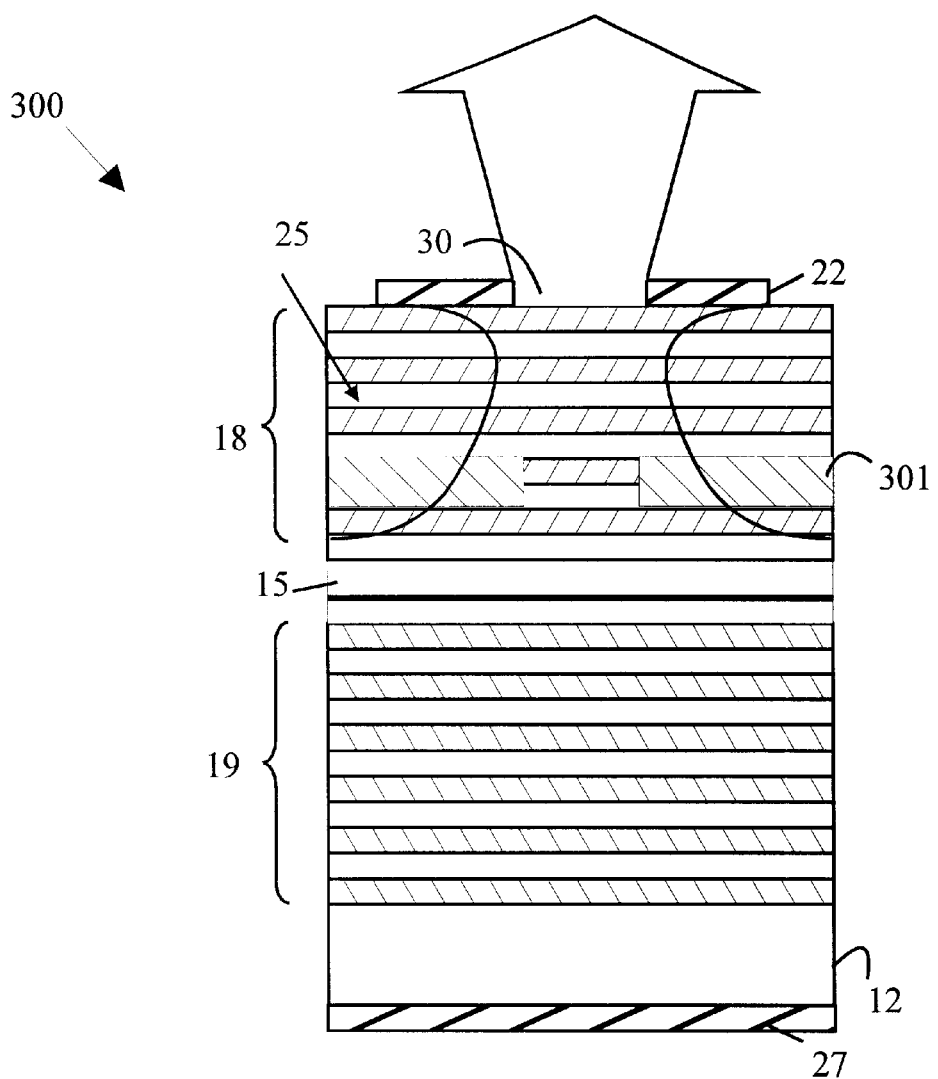
FIG. 2 is a cross-sectional view of an ion-implanted VCSEL 300 that utilizes a mode smoothing layer 301 according to the present invention.

Refer now to FIG. 2, which is a cross-sectional view of a VCSEL 300 according to one preferred embodiment of the present invention. VCSEL 300 utilizes a buried guide structure 301, which enables VCSEL 300 to have a smoother curve. To simplify the following discussion, those elements of VCSEL 300 that perform the same function as corresponding elements in FIG. 1 have been given the same numeric designations.

Figure 3A:
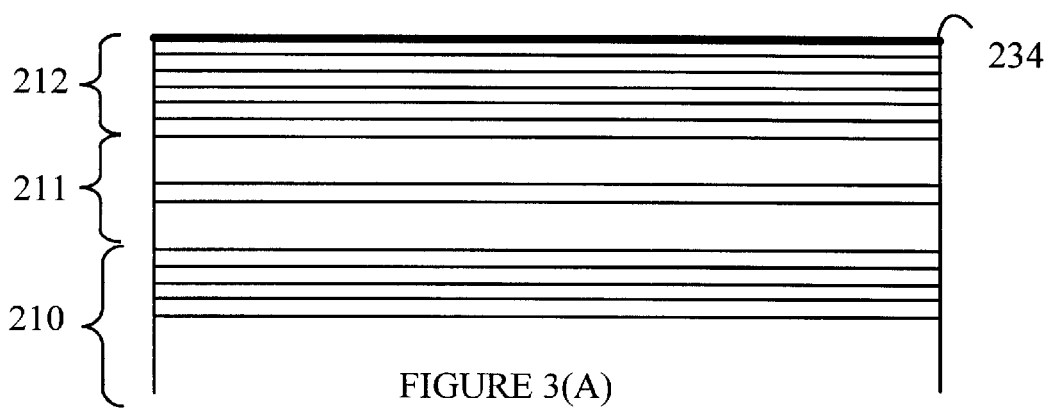
FIGS. 3(A)–3(E) are cross-sectional views of a VCSEL according to the present invention at various stages in the fabrication process.

In the preferred embodiment of the present invention, the guide structure is formed by ion-implantation or diffusion of species into one or more of the layers that make up the top mirror. Refer now to FIGS. 3(A)–3(E), which are cross-sectional views of a VCSEL according to the present invention at various stages in the fabrication process. The various layers needed to provide the bottom mirror 210, active region 211, the first few layers of the top mirror 212 and a thin GaAs cap layer 234 are first fabricated in the conventional manner as shown in FIG. 3(A). The GaAs cap layer is in the order of 50–100 Å thick and is positioned at one of the nulls of the optical field in the optical cavity. This arrangement minimizes the absorption of the light by this GaAs layer while protecting the underlying layers of the structure from oxidation.

Figure 3B:
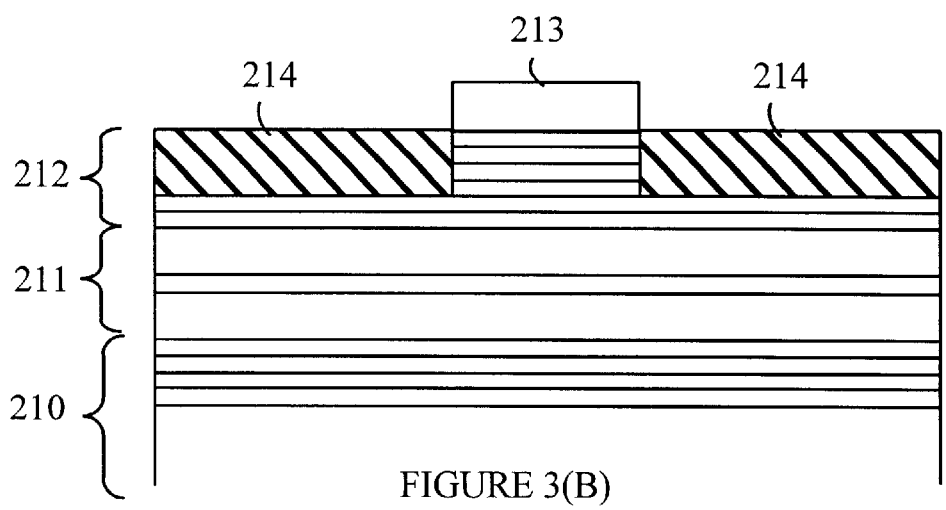

The wafer on which the layers have been deposited is then removed from the epitaxial growth chamber. A mask 213 is then generated over the region that is to become the aperture of the guide structure. The mask is preferably generated by conventional lithographic techniques. The wafer is then implanted or diffused with atomic species to provide the current-confinement regions 214 as shown in FIG. 3(B). The particular species utilized will be discussed in more detail below.

Figure 3C:
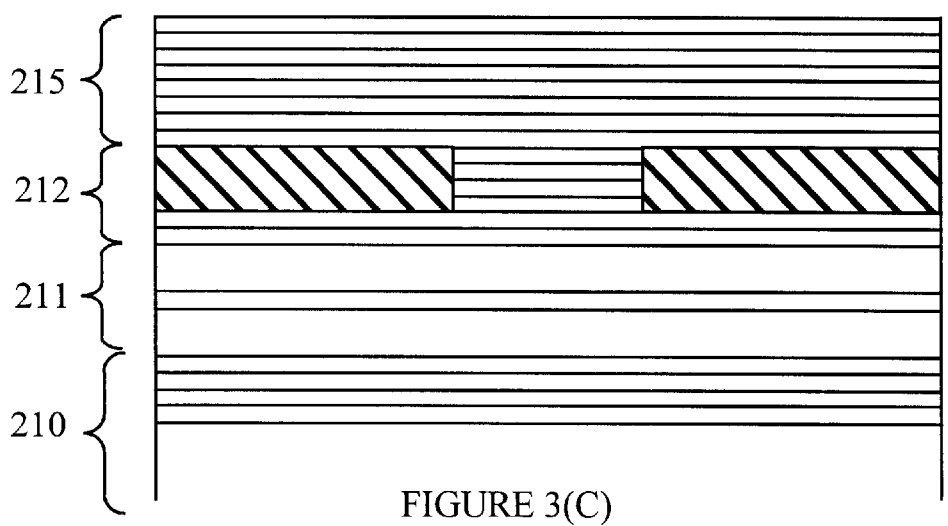

After the introduction of the doping species, the mask is removed and the remaining layers 215 of the top mirror are deposited as shown in FIG. 3(C). The implanted or diffused area must be preserved during the high temperature exposure of the altered region that is encountered during the growth of the remaining mirror layers.

Figure 3D:
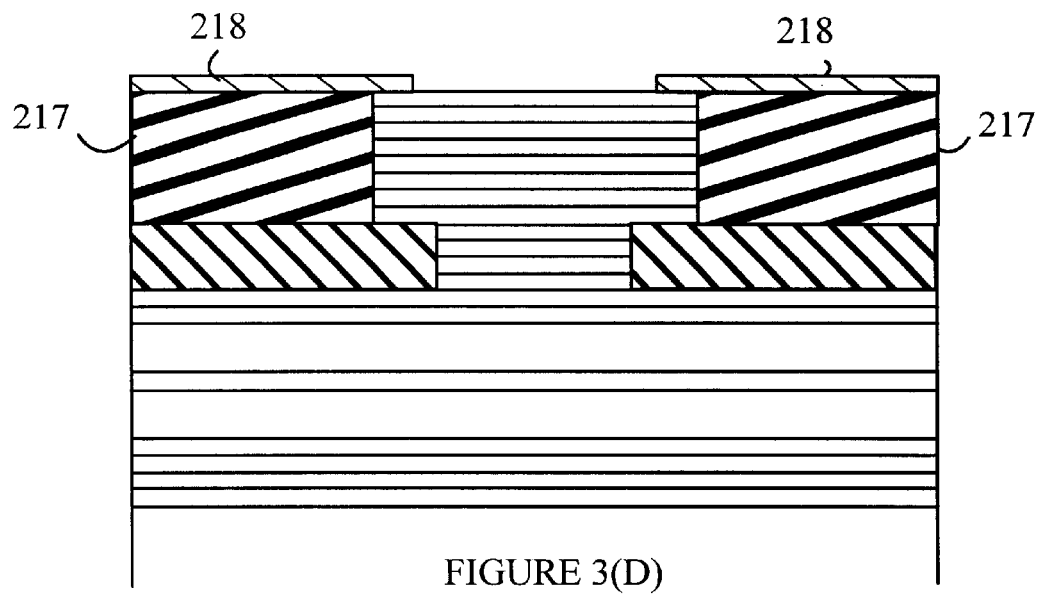
Figure 3E:
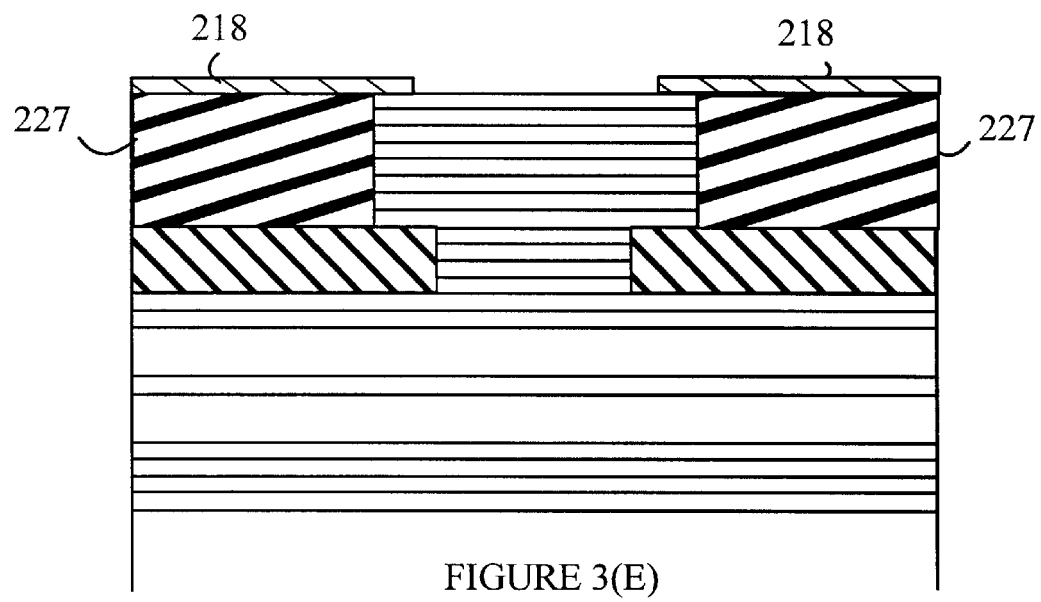

After the deposition of the remaining layers 215 of the top mirror, a high resistive region 217 as shown in FIG. 3(D) is created by an aggregated implantation to reduce the parasitic capacitance of the VCSEL under its top metal contact and bonding pad and to provide the necessary current confinement. If the individual VCSELs are part of an array in which the members are not isolated by cutting a trench between the members of the array, this aggregated implantation should be extended to beyond the light emitting layer to provide isolation of the individual VCSELs as shown at 227 in FIG. 3(E). The isolation implant is constructed by masking the surface of the top mirror and then implanting the unmasked region with hydrogen ions to render the region non-conducting, or at least highly resistive. Since the isolation implant does not define the current confinement region in the device, the isolation implant does not need to extend over the aperture in the current-channeling structure. Hence, the problems discussed above with respect to such implants are not encountered in the present invention.

Finally, the top contact, which includes electrode 218, is deposited. This contact may include a grading layer and contact layers of the same conductivity type as the upper mirrors in addition to the metallic electrode.

The specific implants or diffusion species will now be discussed in more detail. To simplify the following discussion, the term "implant" shall be deemed to include the introduction of a species either by bombardment at an appropriate energy or by diffusion of the species into the material. Since the implanted region does not provide the current channeling function, it does not have to prevent current from flowing through the implant region. For example, if the implanted region is to provide current confinement, it must have a resistivity greater than $5 \times 10^6$ ohm-cm.

The present invention is based on the observation that the aperture region also stabilizes the spatial modes of the VCSEL if the aperture structure is sufficiently close to the active region and certain heavy ions are used as the implantation elements. This mode stabilization results from altering the reflectivity of the mirror layers in the implanted region. If this alteration takes place in a region in which the electric field of the active region is sufficiently strong, a smoothing of the output curve is observed. To achieve this effect, the aperture structure should be within 10 mirror pairs of the active region. The preferred ion species are Cr, Ti, and Fe; however, other heavy ions may also be utilized to alter the reflectivity of the mirror layers outside of the aperture.

The embodiments of the present invention described above have referred to top and bottom mirrors, etc.

However, it will be obvious to those skilled in the art from the preceding discussion that these terms are convenient labels and do not imply any particular spatial orientation.

Various modifications to the present invention will become apparent to those skilled in the art from the foregoing description and accompanying drawings. Accordingly, the present invention is to be limited solely by the scope of the following claims.

What is claimed is:

1. A laser diode comprising:
   a bottom mirror comprising an electrically conducting material;
   a first conductive spacer situated above said bottom mirror;
   a light emitting layer;
   a second conductive spacer situated above said light emitting layer;
   a top mirror comprising a plurality of mirror layers of a semiconducting material of a first conductivity type above said second conductive spacer in which adjacent layers have different indexes of refraction, and
   an aperture defining layer comprising an aperture region and an implant region, said aperture region comprising an aperture semiconducting material of said first conductivity type, said implant region surrounding said aperture region and comprising an implant material that alters the reflectivity of said mirror layers in said implant region.

2. The laser diode of claim 1 wherein said implant region is electrically conducting.

3. The laser diode of claim 2 wherein said aperture defining layer is located within a distance equal to 20 mirror layers of said light emitting layer.

4. The laser diode of claim 1 wherein said implant material comprises an element chosen from the group consisting of Cr, Ti, and Fe.

5. A method for fabricating a light-emitting device, said method comprising the steps of:
   depositing a first semiconducting layer of a first conductivity type;
   depositing a light-emitting layer on said first semiconducting layer;
   depositing a second semiconducting layer of a second conductivity type on said light-emitting layer;
   depositing an aperture defining layer on said second semiconducting layer, said aperture defining layer comprising a semiconducting material of said second conductivity type;
   defining an aperture region in said aperture defining layer;
   implanting an area around said aperture region with impurities to create a region having a reflectivity that is different from that in said aperture region, said aperture region remaining free of said impurities; and
   depositing a third semiconducting layer of said second conductivity type on said second semiconducting layer after said implanting step.

6. The method of claim 5 wherein said impurities comprise an element chosen from the group consisting of Cr, Ti, and Fe.

7. The method of claim 5 wherein said first semiconducting layer comprises a plurality of sub-layers forming a DBR mirror.

8. The method of claim 5 wherein said aperture defining layer comprises a plurality of sub-layers forming a portion of a DRB mirror, said third layer semiconducting layer comprising another portion of said DBR mirror.

* * * * *